US007330368B2

(12) United States Patent
Saito et al.

(10) Patent No.: US 7,330,368 B2
(45) Date of Patent: Feb. 12, 2008

(54) THREE-DIMENSIONAL SEMICONDUCTOR DEVICE PROVIDED WITH INTERCHIP INTERCONNECTION SELECTION MEANS FOR ELECTRICALLY ISOLATING INTERCONNECTIONS OTHER THAN SELECTED INTERCHIP INTERCONNECTIONS

(75) Inventors: Hideaki Saito, Tokyo (JP); Yasuhiko Hagihara, Tokyo (JP); Muneo Fukaishi, Tokyo (JP); Masayuki Mizuno, Tokyo (JP); Hiroaki Ikeda, Tokyo (JP); Kayoko Shibata, Tokyo (JP)

(73) Assignees: NEC Corporation, Tokyo (JP); Elpida Memory Inc., Tokyo (JP)

( * ) Notice: Subject to any disclaimer, the term of this patent is extended or adjusted under 35 U.S.C. 154(b) by 118 days.

(21) Appl. No.: 11/148,363

(22) Filed: Jun. 9, 2005

(65) Prior Publication Data
US 2005/0286286 A1 Dec. 29, 2005

(30) Foreign Application Priority Data
Jun. 29, 2004 (JP) ............................. 2004-191530

(51) Int. Cl.
G11C 5/06 (2006.01)
G11C 8/12 (2006.01)
G11C 8/10 (2006.01)
G11C 7/10 (2006.01)
G11C 8/06 (2006.01)

(52) U.S. Cl. .............. 365/63; 365/230.03; 365/230.02; 365/189.02; 365/230.06; 365/51

(58) Field of Classification Search .................. 365/63, 365/72, 51, 130, 231, 185.05, 185.11, 230.03, 365/230.06, 185.13, 189.02, 230.02; 257/E21.614; 711/117
See application file for complete search history.

(56) References Cited

U.S. PATENT DOCUMENTS

| 5,093,809 | A | * | 3/1992 | Schmitt-Landsiedel et al. .. 365/230.03 |
| 5,170,375 | A | * | 12/1992 | Mattausch et al. ...... 365/230.03 |
| 5,216,637 | A | * | 6/1993 | Vaillancourt ........... 365/230.03 |
| 5,449,215 | A | * | 9/1995 | Viertel et al. .............. 296/97.9 |
| 5,499,215 | A | * | 3/1996 | Hatta ..................... 365/230.03 |
| 5,831,924 | A | * | 11/1998 | Nitta et al. ............. 365/230.03 |
| 6,141,287 | A | * | 10/2000 | Mattausch ............. 365/230.03 |

(Continued)

FOREIGN PATENT DOCUMENTS

JP        04-196263        7/1992

(Continued)

OTHER PUBLICATIONS

Kenji Takahashi, et al.; "Current Status of Research and Development for Three-Dimensional Chip Stack Technology"; Jpn. J. Appl. Phys.; vol. 40; 2001; pp. 3032-3037.

*Primary Examiner*—J. H. Hur
(74) *Attorney, Agent, or Firm*—Dickstein Shapiro LLP

(57) ABSTRACT

In a three-dimensional semiconductor device in which a plurality of semiconductor circuit chips are stacked and that is provided with a plurality of interchip interconnections for signal transmission between these semiconductor circuit chips, when transmitting signals, only one interchip interconnection that serves for signal transmission is selected and other interchip interconnections are electrically isolated by means of switches that are provided between the interchip interconnections and signal lines. Interchip interconnection capacitance relating to the charge and discharge of interconnections is thus minimized.

9 Claims, 9 Drawing Sheets

U.S. PATENT DOCUMENTS 6,278,647 B1 *  8/2001  Saitoh et al. .......... 365/230.03
6,567,290 B2 *  5/2003  Alexanian .................... 365/63
7,057,970 B2 *  6/2006  Kang ...................... 365/238.5

FOREIGN PATENT DOCUMENTS

| | | |
|---|---|---|
| JP | 09-232503 | 9/1997 |
| JP | 2002-026283 | 1/2002 |
| JP | 2003-110086 | 4/2003 |
| JP | 2003-204030 | 7/2003 |

* cited by examiner in-plane interconnection type interchip interconnection type

THREE-DIMENSIONAL SEMICONDUCTOR DEVICE PROVIDED WITH INTERCHIP INTERCONNECTION SELECTION MEANS FOR ELECTRICALLY ISOLATING INTERCONNECTIONS OTHER THAN SELECTED INTERCHIP INTERCONNECTIONS

BACKGROUND OF THE INVENTION

1. Field of the Invention

The present invention relates to a three-dimensional semiconductor device in which a plurality of semiconductor circuit chips are stacked, and more particularly to a three-dimensional semiconductor memory device in which memory cells are formed on stacked semiconductor circuit chips.

2. Description of the Related Art

In recent years, improvements in integration density resulting from the miniaturization of semiconductor integrated circuits have resulted in great advances in the storage capacity in DRAM (Dynamic Random Access Memory) and SRAM (Static Random Access Memory). However, because there are limits to miniaturization of semiconductors, new technologies are being sought to achieve further advances in integration density. Three-dimensional semiconductor devices (stacked semiconductor devices) in which semiconductor circuit chips are stacked have been proposed as one such technology. A method of stacking semiconductor circuit chips to realize large-scale integrated circuits without changing the chip surface area is described in, for example, Japanese Patent Laid-Open Publication No. H04-196263. In this method, memory circuits are integrated on separate chips that are stacked on the main body of semiconductor integrated circuits. In addition, a multilayered memory configuration in which memory cell arrays are multilayered to achieve a further increase in capacity is described in, for example, Japanese Patent Laid-Open Publication No. 2002-026283.

Multilayering of semiconductor circuit chips necessitates interchip interconnections in addition to conventional in-plane interconnections on chip surfaces. Through-vias that pass through chips have been used as interchip interconnections to achieve higher interconnection density. A method in which a silicon chip is thinned to 50 μm, square holes measuring 10 μm on a side are formed in the chip, and the holes then filled with metal to form through-vias for interchip interconnections is described in K. Takahashi et al. in the Japanese Journal of Applied Physics (40, p. 3032 (2001)). By means of these through-vias, interchip interconnections can be arranged two-dimensionally within the chip surface to enable a configuration with several hundred interchip interconnections.

However, in contrast with in-plane interconnections having a thickness of 1 μm or less, through-vias require a thickness of at least 10 μm. This requirement stems from both the difficulty of accurately forming through-holes in a chip with a high aspect ratio due to the restrictions of through-via processing, and the necessity for through-vias that are considerably larger than several μm to achieve the interchip alignment accuracy that is necessary for aligning the positions of through-vias between stacked chips.

Because the cross-sectional shape of through-vias is larger than that of in-plane interconnections, the electrical characteristics of the two types of interconnections differ greatly. Interconnection resistance being inversely proportional to the cross-sectional area of the interconnection, the interconnection resistance of through-vias, which have a large cross section, is lower than that of in-plane interconnections and the conditions for interchip interconnection are therefore more advantageous. However, the amount of parasitic capacitance between an interconnection and a silicon substrate is proportional to the area over which the interconnection confronts the substrate. A through-via is therefore less advantageous than an in-plane interconnection because a through-via interconnection is not only surrounded by the silicon substrate chip, but the through-via has a greater interconnection cross-sectional area and a longer perimeter. For example, if a through-via with a circular profile having a cross-sectional diameter of 20 μm passes through a silicon substrate that is interposed between insulating films each having a thickness of 250 nm and the thickness of the substrate is 50 μm, i.e., the length of the through-via is 50 μm, the parasitic capacitance will be 0.45 pF. The parasitic capacitance of an in-plane interconnection that is in common use is approximately 0.2 pF per 1 mm, meaning that the parasitic capacitance of 0.45 pF of a through-via is equivalent to the parasitic capacitance of in-plane interconnection that is approximately 2 mm long.

In a three-dimensional semiconductor, in-plane interconnections and interchip interconnections extend three-dimensionally to distribute signals to circuits that cover the surfaces of the stacked semiconductor circuit chips. The power consumption that is required for charging and discharging interconnections with each signal transmission increases proportionally with the interconnection capacitance. Accordingly, to reduce power consumption, the interconnection capacitance must be reduced to the minimum.

As an example, the following explanation regards a case as shown in FIG. 1, in which semiconductor circuit chips 30 having a chip size of 20 mm in width and 10 mm in length are stacked in eight layers on interface chip 20, which is a chip for realizing an interface for transmitting signals between semiconductor circuit chips 30 and the outside, signals are distributed to sub-circuit regions 5 that are produced by dividing the surface of each semiconductor circuit chip 30 by eight horizontally and 4 vertically for a total of 32 sites, and through-vias are used for interchip interconnections. Sub-circuit regions 5 described here are banks in which the memory regions have been divided for the purpose of interleaving or divided regions of a memory in which word lines and bit lines are each divided and separate decoders are arranged. Explanation here regards a case in which the chip thickness is 50 μm.

Methods for distributing signals from input/output buffer 10 that is in the corner of lower-most interface chip 20 to all semiconductor circuit chips 30 that are stacked above include the in-plane interconnection type and the interchip interconnection type as shown in FIGS. 2A and 2B. As shown in FIG. 2A, the in-plane interconnection type employs only one interchip interconnection 50 between chips, signals being distributed by in-plane interconnection 40 of the prior art on the surface of each semiconductor circuit chip 30. As shown in FIG. 2B, in the interchip interconnection type, in-plane interconnections 40 are distributed two-dimensionally on interface chip 20, following which 32 interchip interconnections 50 are used to distribute signals vertically to all semiconductor circuit chips 30.

In the in-plane interconnection type that is shown in FIG. 2A, signal transmission is realized by one interchip interconnection 50 between chips, but in the interchip interconnection type that is shown in FIG. 2B, interchip interconnections 50 for signal transmission between semiconductor circuit chips 30 are provided for each of sub-circuit regions 5 having the same position on semiconductor circuit chips 30.

FIG. 3 shows a comparison of the total three-dimensional interconnection capacitance of these two methods that results from changes in the capacitance of through-vias. The calculation of capacitance is based on the assumption that the capacitance of an in-plane interconnection is 0.2 pF per millimeter. In addition, the through-via capacitance on the horizontal axis of FIG. 3 shows the capacitance of one interconnection of one chip (50 µm long). Reference to FIG. 3 reveals that, in the in-plane interconnection type, despite the low degree of dependence on through-via capacitance, the provision of in-plane interconnections on the surface of each semiconductor circuit chip results in a high level of the total three-dimensional interconnection capacitance even when the through-via capacitance is low. On the other hand, dependence on the amount of through-via capacitance is high in the interchip interconnection type, and the total three-dimensional interconnection capacitance therefore increases as the through-via capacitance increases. As result, the interchip interconnection type enables a lower level of total three-dimensional interconnection capacitance than the in-plane interconnection type when the through-via capacitance is low, but when the through-via capacitance exceeds 0.5 pF, the levels of total three-dimensional interconnection capacitance reverse and the interchip interconnection type produces the higher level of total three-dimensional interconnection capacitance. In addition, an increase in the number of sites of in-plane distribution, i.e., an increase in the number of interchip interconnections, results in a further increase in the dependency on the through-via capacitance in the interchip interconnection type.

In a three-dimensional semiconductor device in which a plurality of chips are stacked and three-dimensional interconnections are implemented, the lowest possible capacitance of the interchip interconnections is demanded, but as described in the foregoing explanation, the through-vias that are used in interchip interconnections have a large profile, and reducing the capacitance of the through-via themselves is problematic. Reducing the total three-dimensional interconnection capacitance is therefore problematic in the interchip interconnection type, and because interconnection capacitance resulting from in-plane interconnections increases even in the in-plane interconnection type, total three-dimensional interconnection capacitance is extremely difficult to reduce beyond a certain level.

SUMMARY OF THE INVENTION

The present invention was realized in view of the above-described problems and has as an object the provision of a three-dimensional semiconductor device that enables both high-speed operation and a reduction in power consumption by reducing the interconnection capacitance of signal interconnections for distributing signals to each of stacked semiconductor circuit chips.

To achieve the above-described object, the three-dimensional semiconductor device of the present invention is a three-dimensional semiconductor device in which a plurality of semiconductor circuit chips are stacked with an interface chip for realizing signal transmission between the semiconductor circuit chips and the outside, each of the semiconductor circuit chips is divided into a plurality of sub-circuit regions, and interchip interconnections for realizing signal transmission between each of the semiconductor circuit chips are provided in each of the sub-circuit regions that are in the same position on each of the semiconductor circuit chips, the three-dimensional semiconductor device being provided with: an interchip interconnection selection means on the interface chip for, when transmitting a signal with one sub-circuit region among the plurality of sub-circuit regions, selecting from among the plurality of interchip interconnections an interchip interconnection that is to be the signal transmission path when transmitting the signal and electrically isolating interchip interconnections other than the selected interchip interconnection from the selected interchip interconnection.

According to the present invention, when signal transmission is carried out with one particular sub-circuit region among a plurality of sub-circuit regions, only the interchip interconnection to the sub-circuit region that is carrying out signal transmission is selected, and other interchip interconnections are isolated from the selected interchip interconnection. The present invention therefore enables a reduction of the three-dimensional interconnection capacitance of the signal transmission path, and thus enables a reduction of the power consumption of the three-dimensional semiconductor device and higher data transfer speed.

According to another three-dimensional semiconductor device of the present invention, the three-dimensional semiconductor device further includes: on the interface chip, an in-plane interconnection isolation means for electrically isolating in-plane interconnections that are connected to interchip interconnections other than the interchip interconnection that has been selected by the interchip interconnection selection means from in-plane interconnections that are connected to the interchip interconnection that has been selected by the interchip interconnection selection means; and, on each of the semiconductor circuit chips, a sub-circuit region isolation means for electrically isolating an interchip interconnection that has been selected by the interchip interconnection selection means from sub-circuit regions in which signal transmission is not to be carried out.

According to the present invention, in-plane interconnections that are connected to an interchip interconnection that has been selected by the interchip interconnection selection means and that are not required on the interface chip are electrically isolated by an in-plane interconnection isolation means. Sub-circuit regions that are connected to the interchip interconnection that has been selected by the interchip interconnection selection means and that do not carry out signal transmission on the semiconductor circuit chips are then electrically isolated by the sub-circuit region isolation means. Accordingly, only in-plane interconnections that are required for signal transmission on the interface chip are connected to the selected interchip interconnection, and only one sub-circuit region in which signal transmission is to be carried out is connected to the selected interchip interconnection, whereby a further reduction of three-dimensional interconnection capacitance can be achieved.

In addition, the interchip interconnection selection means may be configuration from: a plurality of first switches that are provided to correspond to each of the plurality of interchip interconnections for switching electrical connections between the interchip interconnections and signal lines, and a first decoder for generating a first control signal for turning ON only the first switch that is provided for the interchip interconnection to the sub-circuit region in which signal transmission is to be carried out.

The sub-circuit region isolation means may be configured to include: a plurality of second switches that are provided to correspond to each of the sub-circuit regions on the plurality of semiconductor circuit chips for switching electrical connections between the sub-circuit regions and interchip interconnections that are provided for the sub-circuit regions; and a second decoder for generating a second control signal for turning ON only the second switch that is provided for the sub-circuit region in which signal transmission is to be carried out.

The present invention can be applied to a three-dimensional semiconductor memory device if the plurality of stacked semiconductor circuit chips are memory cell array chips on which a plurality of memory cells are formed, and signals that are transmitted on the interchip interconnections are data that are to be written to memory cells or data that are read from memory cells.

In addition, signals that are generated from a row decoder and a column decoder for selecting memory cells may be used as the first control signals for selecting and isolating interchip interconnections.

Still further, a bank selection signal for selecting a bank that includes memory cells that are to be activated may be used as the first control signal for selecting and isolating interchip interconnections.

The present invention can also be applied to a three-dimensional semiconductor device in which a memory cell array is composed of a plurality of banks.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 1:
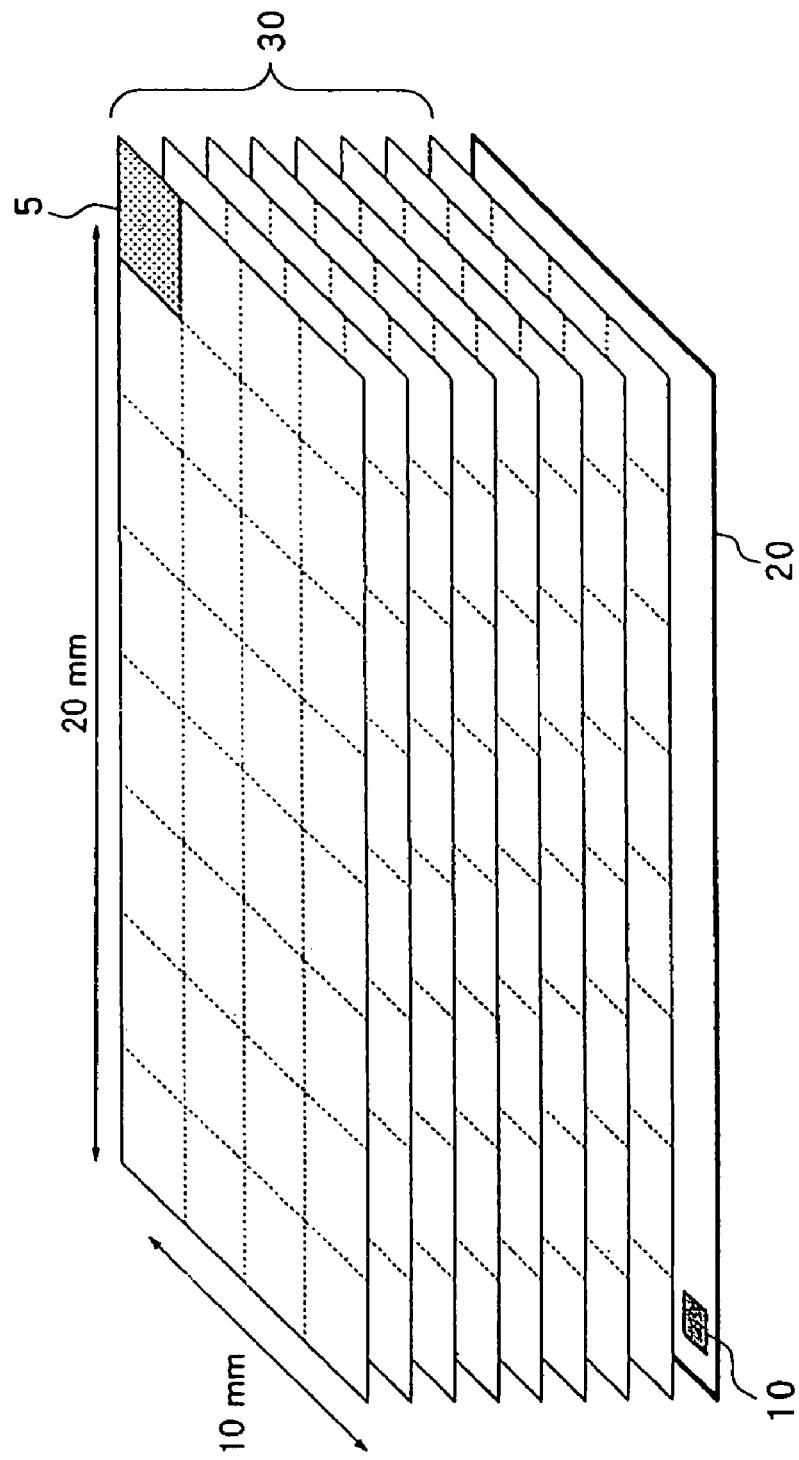
FIG. 1 is a circuit diagram showing a three-dimensional semiconductor circuit.
Figure 2A:
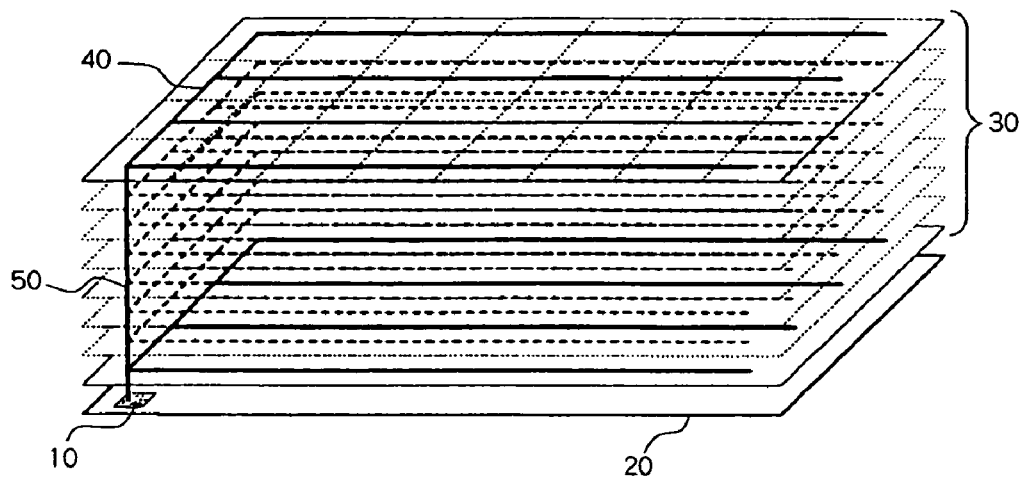
FIG. 2A shows a three-dimensional interconnection diagram of the in-plane interconnection type.
Figure 2B:
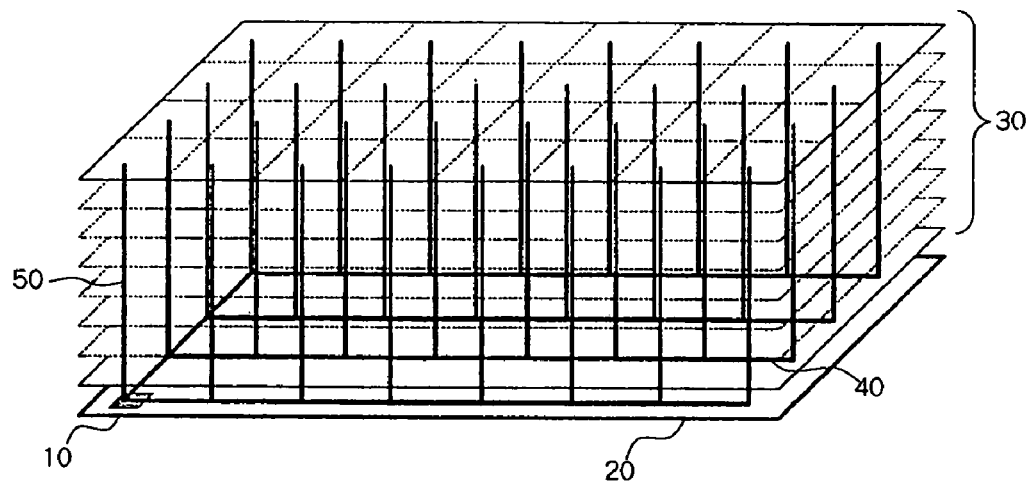
FIG. 2B shows a three-dimensional interconnection diagram of the interchip interconnection type.

Before describing embodiments of the present invention, the following explanation first describes the basic concepts of the present invention. As shown in FIG. 1, the following explanation regards a case in which semiconductor circuit chips 30 having a chip dimension of 20 mm in width and 10 mm in length are stacked in eight layers on interface chip 20, and signals are distributed to sub-circuit regions 5 realized by dividing the surface of each of the stacked semiconductor circuit chips 30 into a total of 32 sites arranged in eight columns and four rows.

Figure 4:
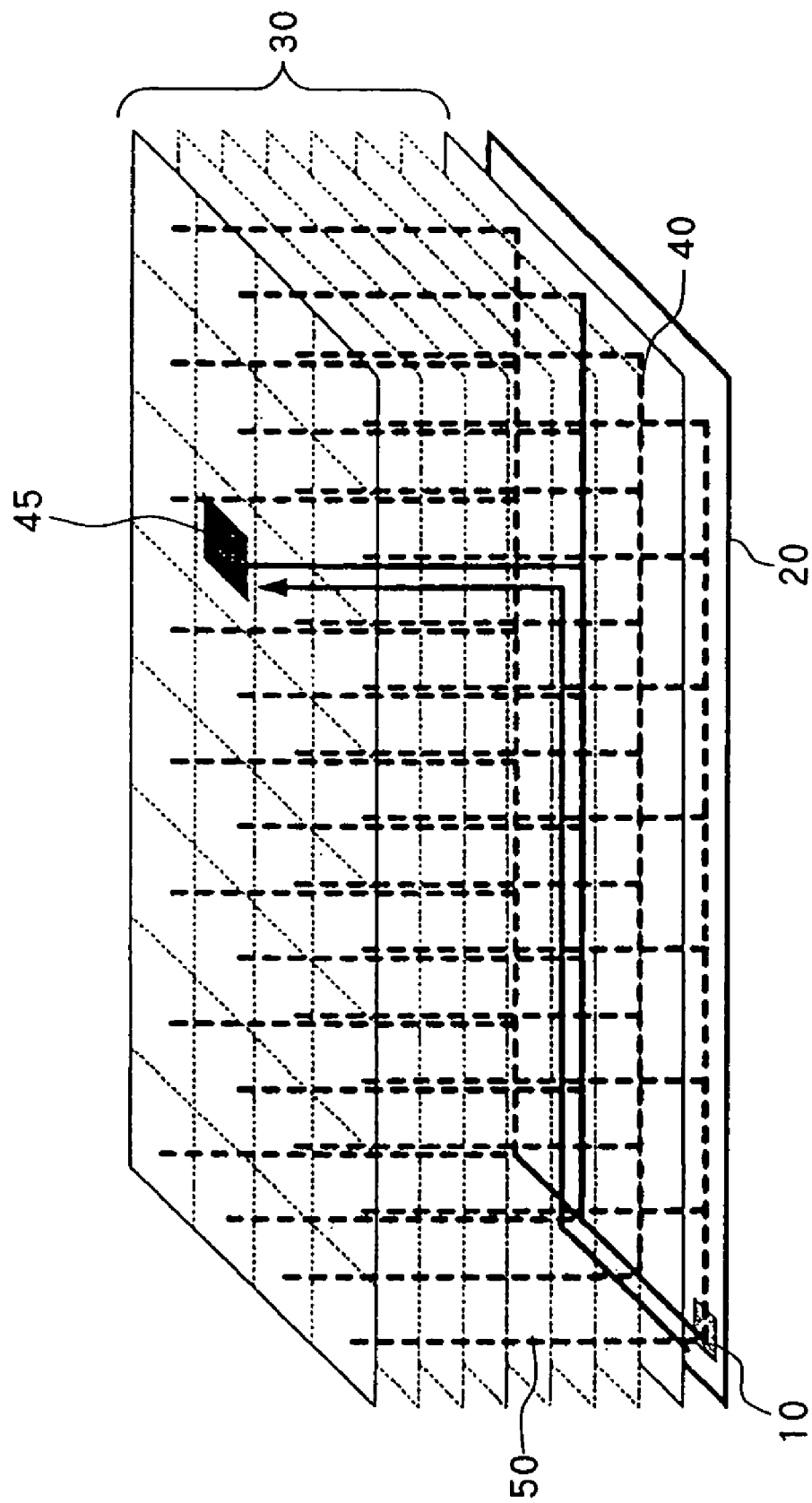
FIG. 4 illustrates the selection of an interchip interconnection.

Among three-dimensional semiconductor devices having this configuration, a three-dimensional semiconductor device exists that is configured such that, when transmitting a signal from input/output buffer 10 of interface chip 20, the circuit region that is the distribution destination is determined with each transmission, instead of transmitting to all circuit regions of all semiconductor circuit chips 30 each time. For example, in the case of a three-dimensional semiconductor memory device in which memory cells are formed on stacked semiconductor circuit chips, the circuits that are integrated on stacked semiconductor circuit chips 30 are memory cell arrays, and the exchange of data with input/output buffer 10 when reading and writing one item of data in one cycle of data transfer is therefore carried out by only the memory cells of one particular site within the memory cell array. Accordingly, as shown in FIG. 4, when transmitting data, the selection of one interchip interconnection 50 that communicates with a particular sub-circuit region 45 of memory cells in which data are to be written or read, and the electrical isolation of other interchip interconnections 50 from interchip interconnection 50 that has been selected will cause no problems in operation.

An interchip interconnection selection means is therefore provided on the interface chip in the present invention. When carrying out signal transmission with one sub-circuit region among a plurality of sub-circuit regions, this interchip interconnection selection means selects from among the plurality of interchip interconnections the interchip interconnection that is to serve as the signal transmission path when transmitting signals and electrically isolates interchip interconnections other than the selected interchip interconnection from the selected interchip interconnection.

In addition, an in-plane interconnection isolation means is provided on the interface chip for electrically isolating in-plane interconnections on the interface chip that are connected to the other interchip interconnections that have not been selected from in-plane interconnections that are connected to the interchip interconnection that has been selected by the interchip interconnection selection means.

A sub-circuit region isolation means is further provided on each semiconductor circuit chip for electrically isolating the interchip interconnection that has been selected by the interchip interconnection selection means and sub-circuit regions in which signal transmission is not being carried out.

The three-dimensional interconnection capacitance can be reduced by thus electrically isolating interchip interconnections that have not been selected from interchip interconnections that have been selected, and further, by electrically isolating as many interconnections and circuits as possible that are connected to interchip interconnections that have been selected.

Figure 3:
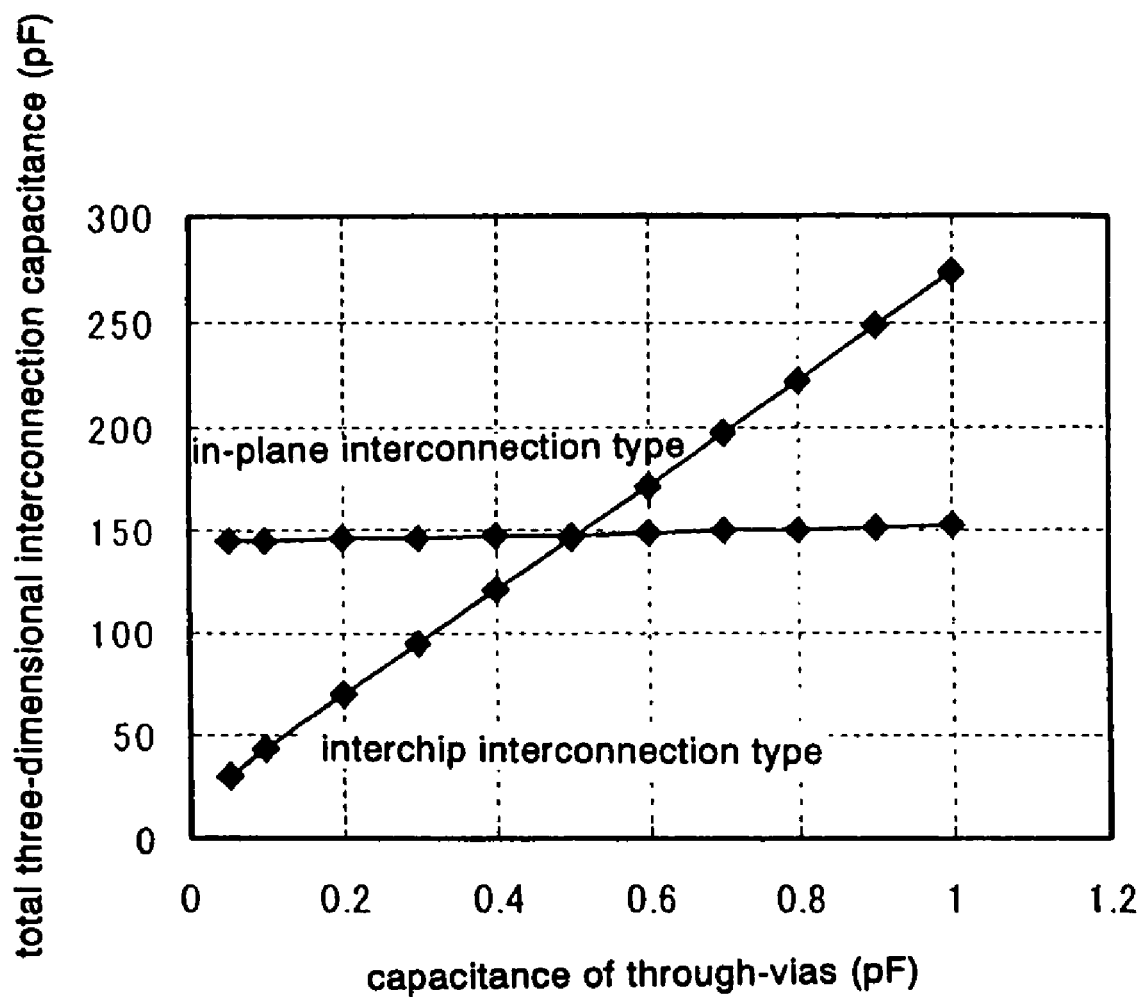
FIG. 3 shows the dependence of three-dimensional interconnection capacitance on through-via capacitance.
Figure 5:
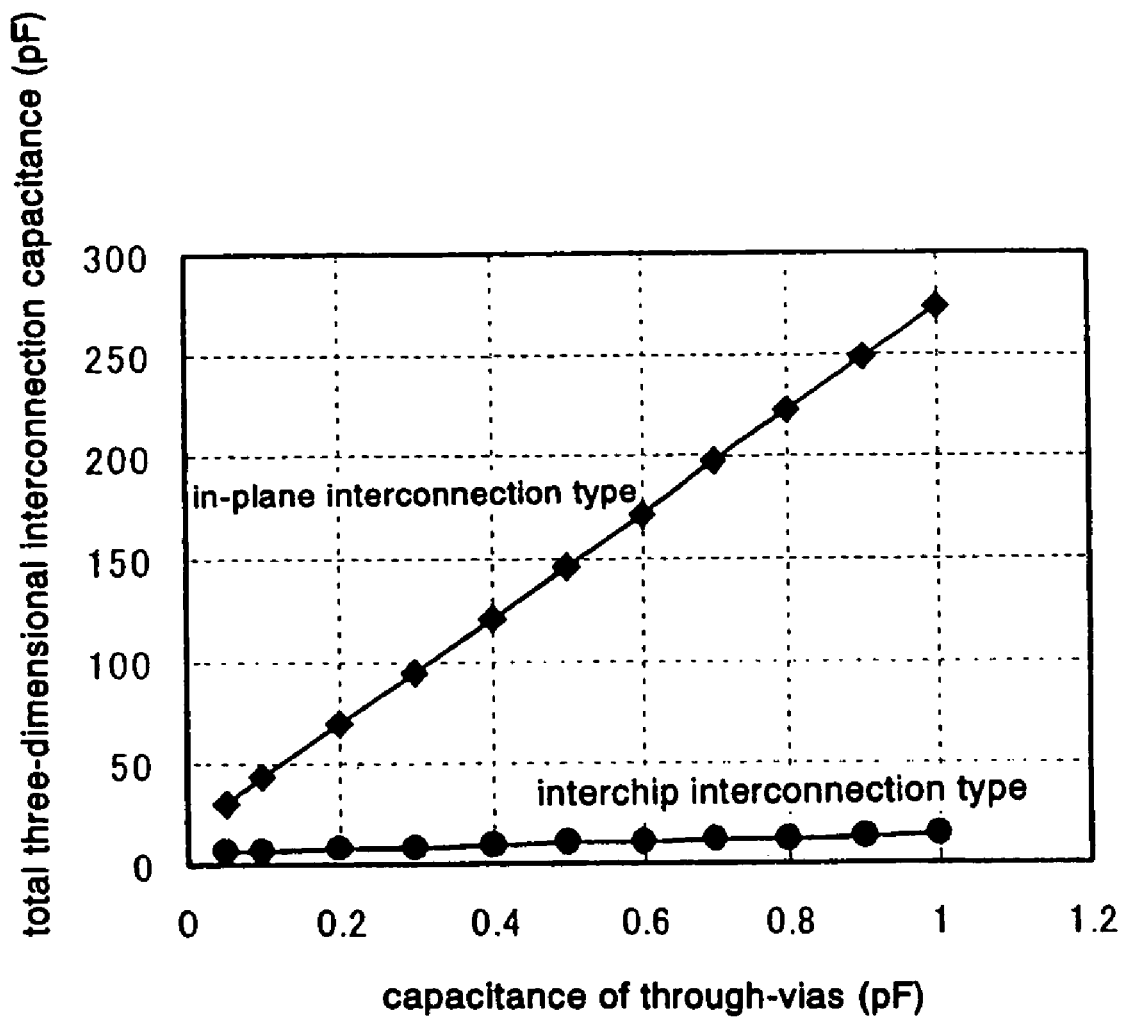
FIG. 5 illustrates the three-dimensional interconnection capacitance during selection of an interchip interconnection.

FIG. 5 shows the total three-dimensional interconnection capacitance for a case in which only one interchip interconnection is selected together with the three-dimensional interconnection capacitance for the interchip interconnection type that was shown in the graph of FIG. 3. Here it can be seen that cutting out interchip interconnections other than the necessary interchip interconnection realizes a major reduction of the three-dimensional interconnection capacitance, whereby the three-dimensional interconnection capacitance is $\frac{1}{14}$ that for a case in which the interchip interconnection is not selected, assuming the capacitance of a through-via is 0.45 pF, which is the capacitance for the case of a through-via formed with a diameter of 20 microns and length of 50 microns. However, because the memory cells that exchange data with input/output buffer 10 change at random with each cycle of data transfer, the selection of interchip interconnections is required with each data transfer. This selection can be realized by control signals that are generated by a decoder having the same functions as the decoder that generates signals for selecting memory cells.

The reduction of interconnection capacitance at the time of data transfer by the method of selecting interchip-interconnections according to the foregoing explanation reduces the electrical power for charging and discharging interconnections. In addition, the decrease in the interconnection load is advantageous for realizing high-speed transmission and more compact driver circuits.

The following explanation regards embodiments of the present invention with reference to the accompanying figures. In the embodiments of the present invention, cases are described in which the three-dimensional semiconductor device is a three-dimensional semiconductor memory device, but the present invention is not limited to such a case and can be similarly applied to any configuration in which stacked semiconductor circuit chips are divided into a plurality of sub-circuit regions and interchip interconnections for signal transmission between each of the semiconductor circuit chips are provided for each of sub-circuit regions that have the same position on each semiconductor circuit chip.

First Embodiment

Figure 6:
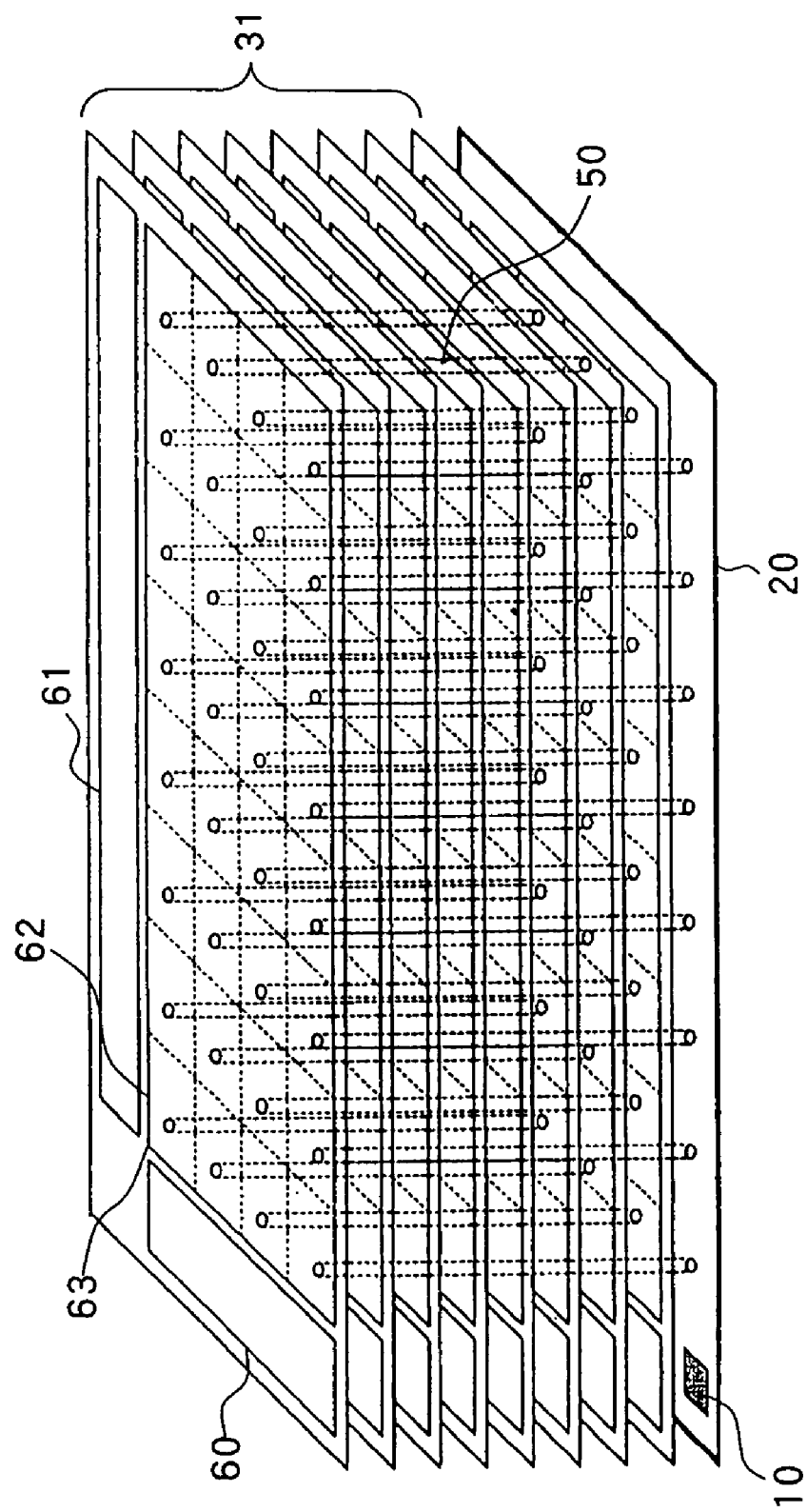
FIG. 6 shows the configuration of a three-dimensional semiconductor DRAM according to the first embodiment.

FIG. 6 shows the configuration of a three-dimensional semiconductor DRAM device, which is a three-dimensional semiconductor device according to the first embodiment of the present invention. In this three-dimensional semiconductor DRAM device, eight memory cell array chips 31 are stacked over interface chip 20 in which circuits for interfacing with the outside are integrated. Memory cell array 63 of 128 Mb, column decoder 61, and row decoder 60 are formed on each memory cell array chip 31.

Interface chip 20 is provided with a circuit for selecting interchip interconnections, a decoder for controlling this circuit, an address buffer, and input/output buffer 10.

Figure 7:
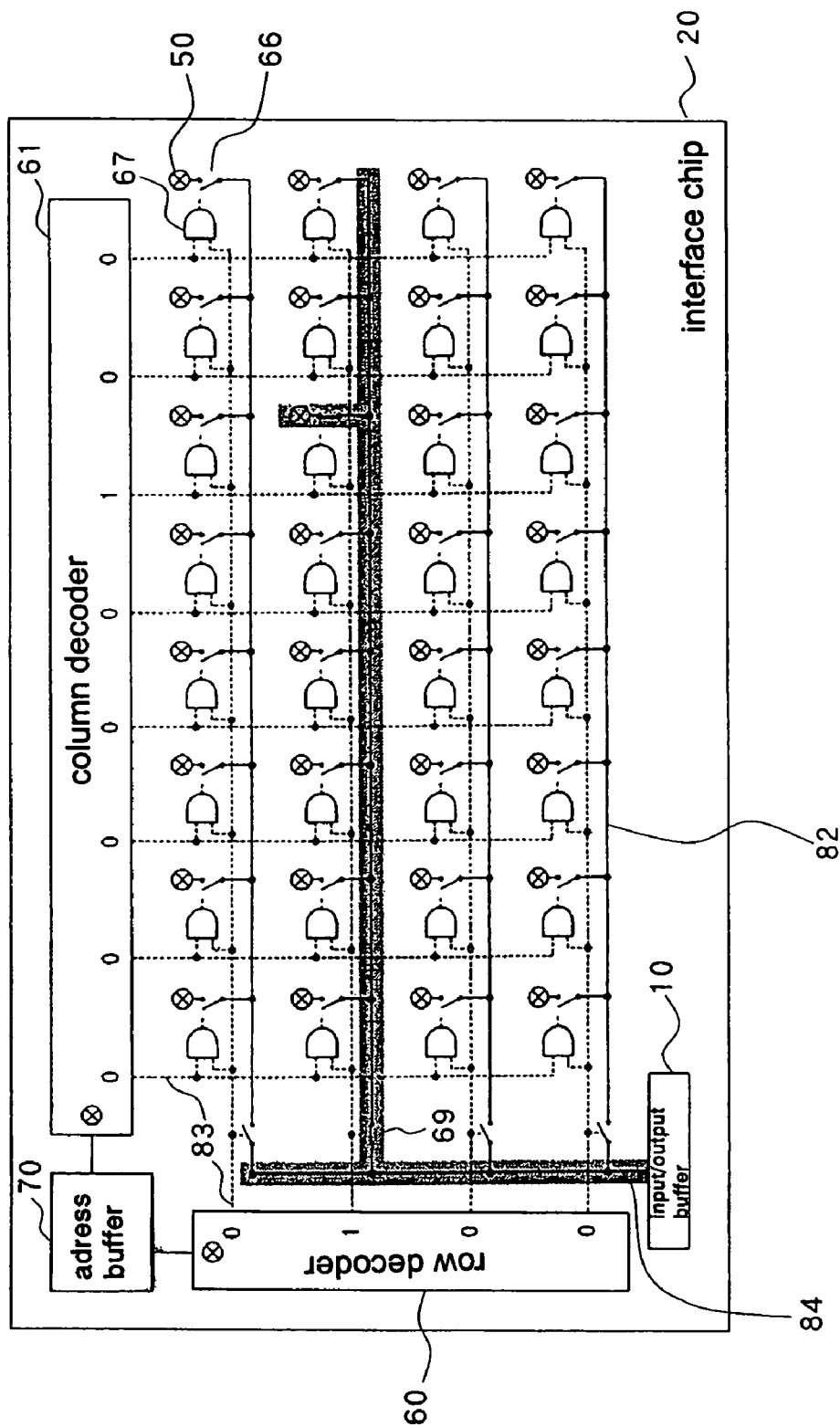
FIG. 7 is a circuit diagram showing the configuration of the interface chip.

Memory cell array 63 of each memory cell array chip 31 is composed of a plurality of sub-memory arrays 62 of 4 Mb obtained by dividing memory cell array 63 into eight columns and four rows for a total of 32 sub-memory arrays 62. Each sub-memory array 62 is connected to interface chip 20 by way of a respective interchip interconnection 50, the total number of interchip interconnections 50 used in data transfer being 32. Interchip interconnections 50 use through-vias that pass through the silicon substrates, i.e., chips. Due to their large diameter of approximately 20 μm and their low resistance, these through-vias are capable of high-speed transmission on the GHz order. FIG. 7 shows the circuit configuration for selecting interchip interconnections and the decoders for transmitting control signals of interface chip 20. One switch 66 is provided before each interchip interconnection 50, and the control of switch 66 is realized by logic circuit 67 that takes the product of selection line signals from column decoder 61 and row decoder 60. To describe in more detail, address signals for selecting sub-memory array regions are sent to column decoder 60 and row decoder 61, and the address signals are decoded according to the location of memory cells on memory cell array chip 31 that are selected.

A plurality of switches 66 are provided to correspond to each of the plurality of interchip interconnections 50, and these switches 66 switch the electrical connection between interchip interconnections 50 and the signal lines from input/output buffer 10. In addition, column decoder 61 and row decoder 60 function as the first decoder for generating control signals for turning ON only switch 66 that is provided for interchip interconnection 50 to sub-memory array 62 in which reading or writing of data is to be carried out.

These switches 66, logic circuit 67, row decoder 60, and column decoder 61 together make up an interchip interconnection selection means for selecting interchip interconnection 50 that is the signal transmission path during signal transmission and electrically isolating interchip interconnections 50 other than interchip interconnection 50 that has been selected from selected interchip interconnection 50.

A column address signal and a row address signal are each sent from address buffer 70, to which an encoded signal for selecting memory cell array 63 has been sent, to column decoder 61 and row decoder 60, respectively, and these address signals are decoded according to the memory that is selected on memory cell array chips 31. For example, if a memory cell to which data are to be transferred exists in sub-memory array 62 that is in the sixth column from the left and the third row from the bottom of memory cell array chip 31, interchip interconnection 50 of the corresponding location on interface chip 20 is selected. In this case, if the signal of the sixth selection line from the left of column decoder 61 is set to "1," the signal of the third selection line 83 from the bottom of row decoder 60 is set to "1," and the signals of the other selection lines 83 are left unchanged at "0," signal "1" is supplied as output only from logic circuit 67 that takes the product of "1" and "1," which are the signals from column decoder 61 and row decoder 60, only one switch 66 that precedes one interchip interconnection 50 is turned ON, and one interchip interconnection 50 is selected.

Regarding the in-plane horizontal interconnections as well, in-plane interconnection isolation switches 69 that function as in-plane interconnection isolation means are provided immediately following the branching from the vertical interconnection that is directly connected to input/output buffer 10. Thus, only one horizontal interconnection is selected by the third selection line from the bottom in which the signal from row decoder 60 is "1," and the other horizontal interconnections are electrically isolated from the signal line.

One sub-memory array 62 on each of eight stacked memory cell array chips 31 is thus connected to the one interchip interconnection 50 that has been selected on interface chip 20 as described in the foregoing explanation. However, sub-memory array 62 in which data writing or reading is to be carried out is limited to just one sub-memory array 62 on one memory cell array chip 31, and the remaining seven sub-memory arrays 62 need not be connected to interchip interconnection 50 and here serve only to increase the interconnection capacitance.

Figure 8:
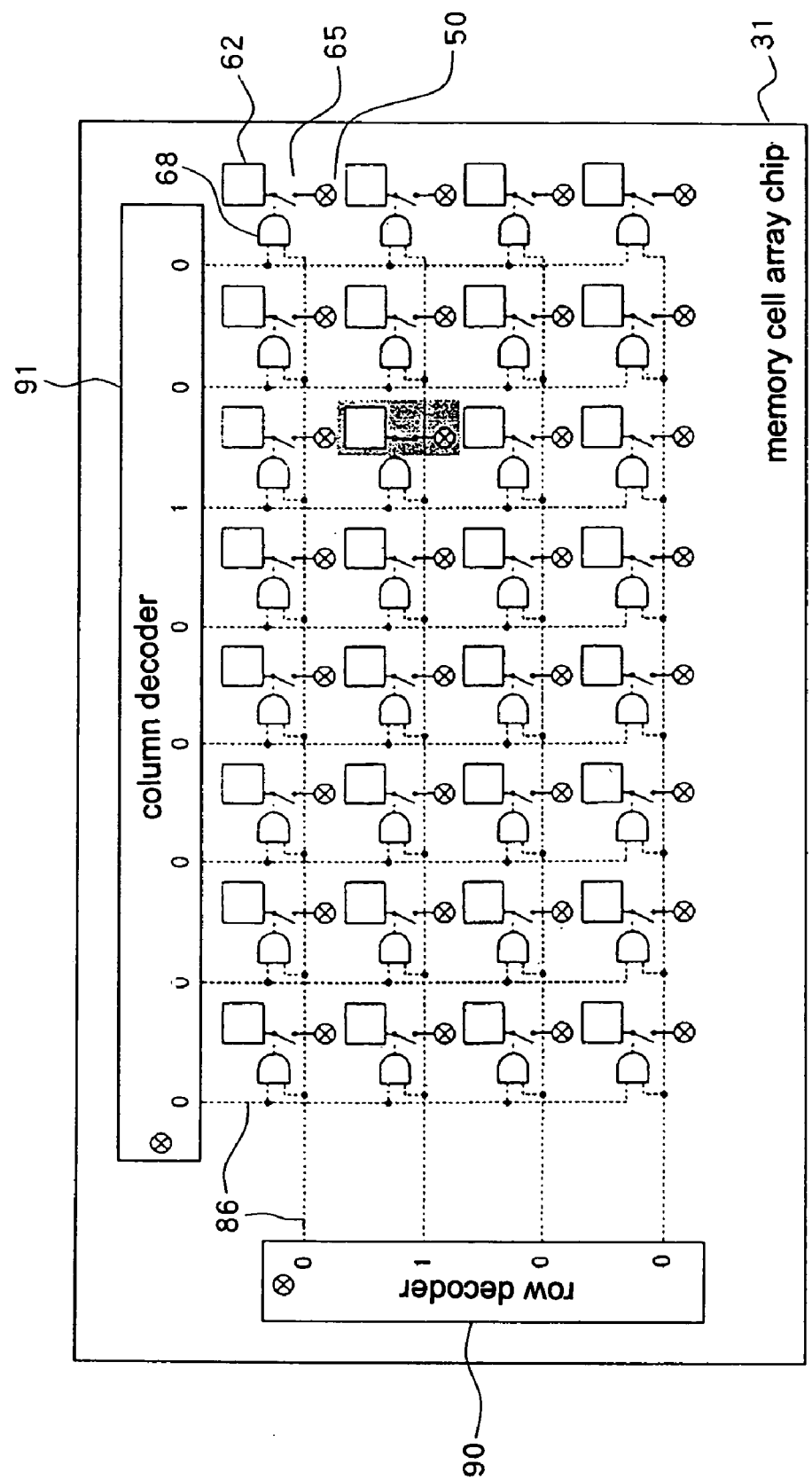
FIG. 8 is a circuit diagram showing the configuration of a memory cell array chip.

Thus, as shown in the circuit configuration of memory cell array chip 31. of FIG. 8, switches 65 are provided following interchip interconnections 50 for cutting off sub-memory arrays 62 in which data writing or reading is not to be carried out from interchip interconnection 50, and by means of these switches, sub-memory arrays 62 in which data writing or data reading is not to be carried out are cut off.

Switches 65 are provided for each of sub-memory arrays 62 on the plurality of memory cell array chips 31 and switch the electrical connections between sub-memory arrays 62 and interchip interconnections 50 that are provided for each of sub-memory arrays 62.

Row decoder 60 and column decoder 61 function as the second decoder for generating control signals for turning ON only switches 65 that are provided for sub-memory arrays 62 in which data writing or reading is to be carried out.

The operation by which column decoder 91 and row decoder 90 each set one signal among selection lines 86 to "1" whereby the output of only one logic circuit 67 is "1" and only one switch 65 is turned ON is equivalent to the case of column decoder 61 and row decoder 60 that are shown in FIG. 7, and redundant explanation of this operation is therefore here omitted.

The sub-circuit region isolation means for electrically isolating selected interchip interconnection 50 from sub-memory arrays 62 in which data writing or reading is not to be carried out on the semiconductor circuit chips is configured from these switches 65, logic circuits 68, row decoder 60, and column decoder 61. The use of this type of sub-circuit region isolation means enables electrical connection between interchip interconnection 50 that has been selected and only one sub-memory array 62 in which data writing or reading is to be carried out from among the eight sub-memory arrays 62 that are connected to the one interchip interconnection 50 that has been selected.

When data writing or reading is carried out to a three-dimensional semiconductor memory device, the memory cells that make up sub-memory arrays 62 are selected one after another, and interchip interconnections 50 are therefore selected one after another in unison with this operation.

As described in the foregoing explanation, according to the three-dimensional semiconductor memory device of the present embodiment, when signals are being distributed to each memory cell array chip 31, only the interchip interconnection that is to be the path of signal transmission is selected at the time of signal transmission and interchip interconnections other than this interchip interconnection are electrically isolated from the interchip interconnection that has been selected, whereby the interconnection capacitance that is necessary for charging and discharging at the time of signal transmission can be decreased. Accordingly, the present embodiment can reduce the power consumption of a three-dimensional semiconductor DRAM device and further, can realize a higher speed of data transfer.

Although a case was described in the present embodiment in which the semiconductor memory device was DRAM, the present invention is not limited to this case and can adopt a similar configuration when the semiconductor memory device is SRAM.

Furthermore, because a semiconductor memory device was used for explanation in the present embodiment, logic circuit 67 was used for calculating the logical product of signals from row decoder 60 and column decoder 61, but when the sub-circuit regions do not have a matrix configuration, switches 66 can be controlled by the control signals of a decoder for generating control signals for implementing ON/OFF control of switches 66.

Second Embodiment

The following explanation regards the second embodiment of a three-dimensional semiconductor device according to the present invention. In the present embodiment, the present invention is applied to a three-dimensional DRAM semiconductor device having a multibank configuration.

Figure 9:
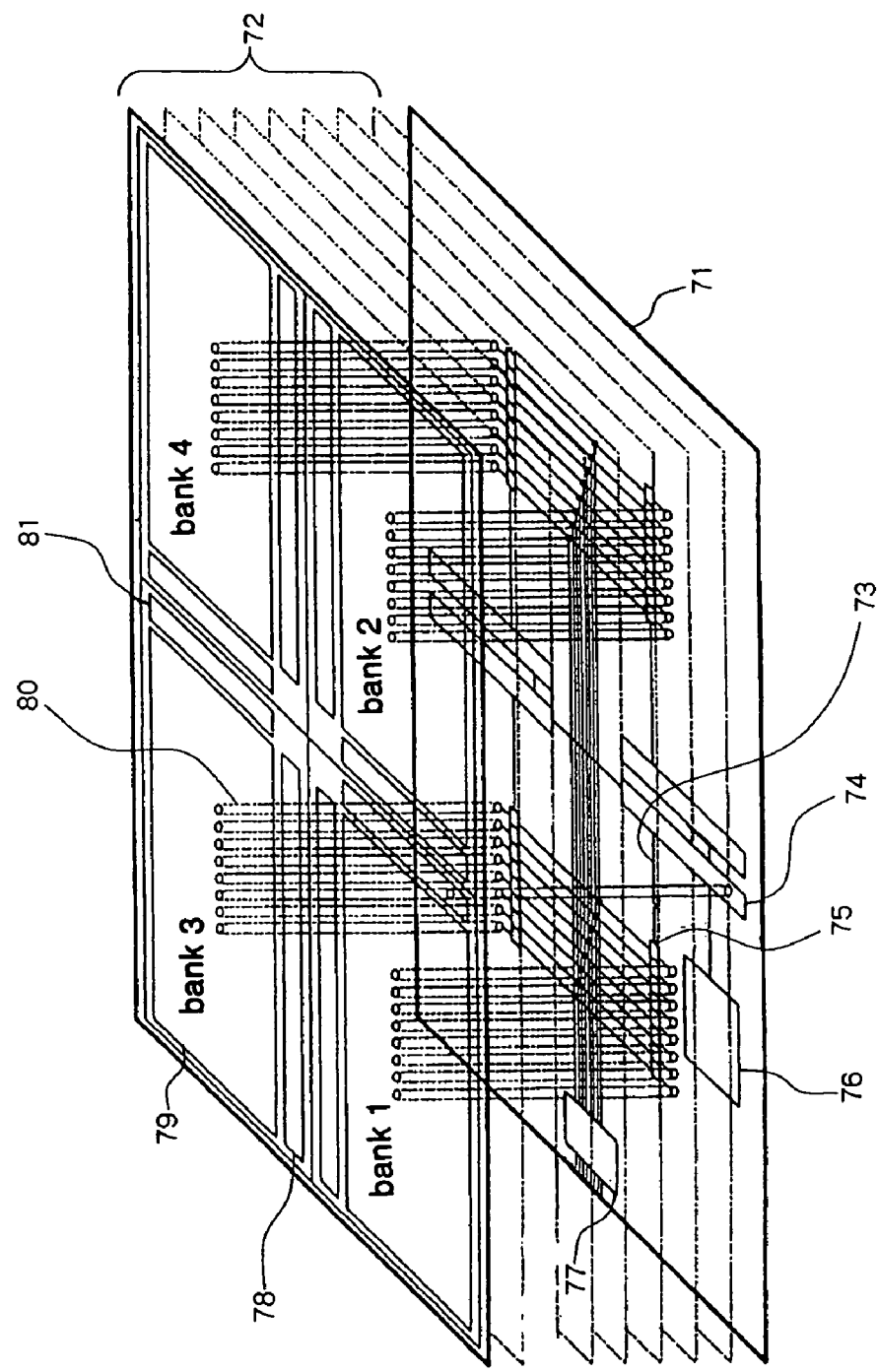
FIG. 9 shows the configuration of a three-dimensional semiconductor DRAM according to the second embodiment.

FIG. 9 shows the three-dimensional semiconductor DRAM device that is the second embodiment of the present invention, memory cell array chips 72 each having four banks and the selection of interchip interconnections being carried out when selecting banks. In a multibank configuration, memory cells are accessed by designating addresses in bank units, whereby, when accessing a memory cell of a particular bank, interleaving can be carried out in other banks, this interleaving including precharging operations, or further, operations for selecting word lines and activating bit lines, or refresh operations, and banks can therefore be accessed one after another and data transferred continuously.

In FIG. 9, eight memory cell array chips 72 are stacked on the upper surface of interface chip 71, which has input/output buffer 77 with the outside, and each memory cell array chip 72 is divided into the four regions of banks 1-4 to have four bank configurations on the chip surface. The input/output bit number is eight bits, and eight interchip interconnections 80, eight being the number of bits, are connected to each bank from input/output buffer 77 of interface chip 71. In other words, data in eight-bit portions are delivered from input/output buffer 77 of interface chip 71 to the four divided regions in the chip surface using the interchip interconnections. Switches 75 for electrically isolating interchip interconnections are provided before interchip interconnections 80 on interface chip 71.

The following explanation regards the procedure for selecting interchip interconnections when reading and writing data for the three-dimensional semiconductor DRAM device of FIG. 9. In the case of DRAM, when activating memory cells in which reading or writing of data is to be carried out, words lines are first selected by an internal signal referred to as a RAS (Row Address Strobe) signal and bit lines are activated, following which bit lines that are connected to column selection signal lines are selected by an internal signal referred to as a CAS (Column Address Strobe) signal, whereupon data are written to (or read from) the memory cells at the intersections of the selected word lines and bit lines. These RAS signals and CAS signals are generated by column decoder 78 and row decoder 81 that are provided in each bank. Finally, the word lines are placed in a non-selected state and the bit lines are placed in a non-activated state. Whether when reading or writing, a RAS signal contains a bank selection signal for selecting one of the four banks that contains memory cells that are to be activated, and the bank having memory cells that are to be activated is selected at the timing of RAS signal generation. Accordingly, interchip interconnections 80 that are connected to each bank can be selected by using the bank selection signal of the RAS signal for activating DRAM memory cells.

More specifically, RAS signal line 73 from row decoder 74 is connected to switch 75 for isolating each interchip interconnection 80 from the signal line from input/output buffer 77. When data are to be written to (or read from) memory cells that belong to a particular bank, only RAS signal line 73 that supplies output to switch 75 that is provided to correspond to interchip interconnections 80 of that bank is activated and connected to the signal lines from input/output buffer 77. Interchip interconnections 80 of other banks that have not been selected are electrically isolated from these signal lines. For example, when activating memory cells that are contained in bank 1, interchip interconnections 80 that correspond to bank 1 are connected to signal lines from input/output buffer 77, and interchip interconnections 80 that correspond to banks 2-4 are electrically isolated from these signal lines.

When writing to (or reading from) DRAM memory cells, a three-dimensional interconnection path is selected by the RAS signal that is first produced, and a new latency for selecting interchip interconnections therefore does not occur until after a CAS signal is subsequently sent and data then written.

The present embodiment can reduce the interconnection capacitance that is required for charging and discharging during signal transmission for a three-dimensional semiconductor DRAM memory device of multibank configuration because, based on a bank selection signal that is contained in RAS, only interchip interconnections 80 to a bank that is activated are connected to signal lines, and interchip interconnections to other banks are electrically isolated from the interchip interconnections to the bank that is activated. Accordingly, the present embodiment can reduce power consumption in a three-dimensional semiconductor DRAM device, as in the above-described first embodiment.

While preferred embodiments of the present invention have been described using specific terms, such description is for illustrative purposes only, and it is to be understood that changes and variations may be made without departing from the spirit or scope of the following claims.

What is claimed is:

1. A three-dimensional semiconductor device in which a plurality of semiconductor circuit chips are stacked with an interface chip for realizing signal transmission from the semiconductor circuit chips, wherein each of said semiconductor circuit chips is divided into a plurality of sub-circuit regions, and comprises a plurality of interchip interconnections for realizing signal transmission between each of said semiconductor circuit chips are provided in each of the sub-circuit regions that are in the same position on each of said semiconductor circuit chips, the device comprising:

an interchip interconnection selection means is provided on said interface chip for, when transmitting a signal with one sub-circuit region among said plurality of sub-circuit regions, selecting from among said plurality of interchip interconnections an interchip interconnection that is to be the signal transmission path when transmitting the signal and electrically isolating interchip interconnections other than the selected interchip interconnection from the selected interchip interconnection; and on said interface chip, an in-plane interconnection isolation means for electrically isolating in-plane interconnections that are connected to interchip interconnections other than the interchip interconnection that has been selected by said interchip interconnection selection means from in-plane interconnections that are connected to the interchip interconnection that has been selected by said interchip interconnection selection means.

2. The three-dimensional semiconductor device according to claim 1, wherein said interchip interconnection selection means comprises:

a plurality of first switches that are provided to correspond to each of said plurality of interchip interconnections for switching electrical connections between the interchip interconnections and signal lines, and a first decoder for generating a first control signal for turning ON only the first switch that is provided for the interchip interconnection to the sub-circuit region in which signal transmission is to be carried out.

3. The three-dimensional semiconductor device according to claim 2, wherein said plurality of stacked semiconductor circuit chips are memory cell array chips in which a plurality of memory cells are formed, and signals that are transmitted on said plurality of interchip interconnections are data to be written to said plurality of memory cells or data to be read from said plurality of memory cells.

4. The three-dimensional semiconductor device according to claim 3, wherein said first control signals for selecting and isolating interchip interconnections are signals generated from a row decoder and a column decoder for selecting memory cells.

5. The three-dimensional semiconductor device according to claim 3, wherein said first control signals for selecting and isolating interchip interconnections are bank selection signals for selecting banks that contain memory cells that are to be activated.

6. The three-dimensional semiconductor device according to claim 1, wherein said plurality of stacked semiconductor circuit chips are memory cell array chips in which a plurality of memory cells are formed, and signals that are transmitted on said plurality of interchip interconnections are data to be written to said plurality of memory cells or data to be read from said plurality of memory cells.

7. The three-dimensional semiconductor device according to claim 1, further comprising:

on each of said semiconductor circuit chips, a sub-circuit region isolation means for electrically isolating an interchip interconnection that has been selected by said interchip interconnection selection means from sub-circuit regions in which signal transmission is not to be carried out.

8. The three-dimensional semiconductor device according to claim 7, wherein said sub-circuit region isolation means comprises:

a plurality of second switches that are provided to correspond to each of said sub-circuit regions on said plurality of semiconductor circuit chips for switching electrical connections between said sub-circuit regions and interchip interconnections that are provided for the sub-circuit regions; and a second decoder for generating a second control signal for turning ON only the second switch that is provided for the sub-circuit region in which signal transmission is to be carried out.

9. The three-dimensional semiconductor device according to claim 1, wherein said interchip interconnections are through-vias that pass through the semiconductor substrates.

* * * * *